(12) United States Patent
Chen et al.

(10) Patent No.: US 11,482,449 B2
(45) Date of Patent: Oct. 25, 2022

(54) ELECTRICAL COMPONENT WITH A DIELECTRIC PASSIVATION STACK

(71) Applicant: General Electric Company, Schenectady, NY (US)

(72) Inventors: Cheng-Po Chen, Niskayuna, NY (US);
Reza Ghandi, Cohoes, NY (US);
David Richard Esler, Gloversville, NY (US); David Mulford Shaddock, Troy, NY (US); Emad Andarawis Andarawis, Ballston Lake, NY (US);
Liang Yin, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/983,380

(22) Filed: Aug. 3, 2020

(65) Prior Publication Data
US 2022/0037201 A1  Feb. 3, 2022

(51) Int. Cl.
*H01L 23/48* (2006.01)
*H01L 21/768* (2006.01)
*H01L 21/02* (2006.01)
*H01L 23/31* (2006.01)
*H01L 23/00* (2006.01)
*H01L 23/532* (2006.01)

(52) U.S. Cl.
CPC .. *H01L 21/76832* (2013.01); *H01L 21/02172* (2013.01); *H01L 23/3192* (2013.01); *H01L 23/53252* (2013.01); *H01L 24/05* (2013.01); *H01L 2224/05599* (2013.01); *H01L 2924/1904* (2013.01)

(58) Field of Classification Search
None
See application file for complete search history.

(56) References Cited

U.S. PATENT DOCUMENTS

| | | | |
|---|---|---|---|
| 3,683,105 A | 8/1972 | Shamash et al. | |
| 5,734,188 A * | 3/1998 | Murata | H01L 27/105 257/E27.081 |
| 7,382,013 B2 | 6/2008 | Uchida et al. | |
| 7,550,319 B2 | 6/2009 | Wang et al. | |
| 8,023,269 B2 | 9/2011 | Mitchell et al. | |
| 8,383,462 B2 | 2/2013 | Loiselet | |
| 8,476,743 B2 | 7/2013 | Nguyen et al. | |
| 2003/0146502 A1 | 8/2003 | Parsons | |
| 2008/0001290 A1 * | 1/2008 | Chou | H01L 23/53252 257/E23.079 |
| 2019/0361180 A1 | 11/2019 | Lam et al. | |
| 2020/0273769 A1 * | 8/2020 | Xia | H01L 23/045 |

FOREIGN PATENT DOCUMENTS

JP  2015-25120  *  2/2015  ... H01L 2224/32245

* cited by examiner

*Primary Examiner* — Hung K Vu
(74) *Attorney, Agent, or Firm* — Fitch, Even, Tabin & Flannery LLP

(57) ABSTRACT

An electrical component and method for manufacturing the electrical component with a substrate a conductor stack having multiple layers and including at least one electrically conductive path. The conductor stack mounted to the substrate with a dielectric passivation stack encasing at least a portion of the conductor stack.

17 Claims, 6 Drawing Sheets

ELECTRICAL COMPONENT WITH A DIELECTRIC PASSIVATION STACK

TECHNICAL FIELD

The disclosure generally relates to an electrical component for operating in high temperature environments, in particular an electronic device such as a circuit board assembly or a semiconductor chip or a combination, with conductor stacks interconnecting components and forming a circuit.

BACKGROUND

Electronic devices are typically designed, manufactured, and rated for operation at temperatures up to 125° C. In some applications, such as in internal combustion engines or aircraft engines, zones with temperatures far exceeding 125° C. exist. Existing solutions favor placing electronic devices away from the hot zones or using active cooling to maintain a lower temperature than the environment. These strategies add additional complexity, weight, cost, and reliability issues. As propulsion systems evolve and operate at ever increasing temperature while shrinking in volume, the cool zones also shrink or disappear. High temperatures in excess of 300° C. combined with corrosive atmosphere accelerates the corrosion and degradation of conventional interconnect conductors in electronic devices.

BRIEF DESCRIPTION

Aspects and advantages of the disclosure will be set forth in part in the following description, or may be obvious from the description, or may be learned through practice of the disclosure herein.

In one aspect, the present disclosure relates to an electrical component comprising a substrate defining a base of the electrical component; a conductor stack having multiple stacked layers including an upper layer, an inner layer, and an adhesion layer, defining at least a portion of an electrically conductive path, and mounted to the substrate; a dielectric passivation stack encasing at least a portion of the conductor stack and defining at least one opening for connection to the electrically conductive path; and an electrically conductive cap configured to close the opening and further defining the electrically conductive path.

In another aspect, the present disclosure relates to a method of manufacturing an electronic component comprising forming a conductor stack with multiple stacked layers comprising applying an adhesion material to form an adhesion layer; applying a barrier material on the adhesion layer to form an inner layer; applying a highly conductive material onto the inner layer to form an upper layer; and encasing the conductor stack in a dielectric passivation stack forming at least one opening in the passivation stack for an electrical connection.

These and other features, aspects and advantages of the disclosure herein will become better understood with reference to the following description and appended claims. The accompanying drawings, which are incorporated in and constitute a part of this specification, illustrate examples of the disclosure and, together with the description, serve to explain the principles of the disclosure herein.

BRIEF DESCRIPTION OF THE DRAWINGS

A full and enabling disclosure, including the best mode thereof, directed to one of ordinary skill in the art, is set forth in the specification, which makes reference to the appended figures in which.

DETAILED DESCRIPTION

Aspects of the present disclosure are related to an electrical component having a conductor stack with multiple stacked layers. The layers as stacked in a specific order to increase the lifetime of the electrical component. While the examples described herein are directed to the application of a power distribution panel for an aircraft, the disclosure can be applied to any implementation of a power distribution panel in all aspects of electrical circuitry.

Electronic devices are typically designed, manufactured, and rated for operation at temperatures up to 85° C. (automotive) and 125° C. (military). In some applications, such as in internal combustion engines or aircraft engines, there are zones with temperatures far exceeding 125° C. Existing solutions favor placing electronic devices away from the hot zones or using active cooling to maintain a lower temperature than the environment. These strategies add additional complexity, weight, cost, and reliability issues. As propulsion systems evolve and operate at ever increasing temperature while shrinking in volume, the cool zones also shrink or disappear. High temperatures in excess of 300° C. combined with corrosive atmosphere accelerates the corrosion and degradation of conventional interconnect conductors in electronic devices. In order to maintain sufficient operational life, electronic devices must employ multiple novel strategies to extend their useful life in those harsh environments. The present disclosure is toward an electronic device that utilizes a combination of conductor stacks, dielectric passivation stacks, and hermetically sealed package to extend the operating life of devices located in a high temperature environment.

Figure 1:
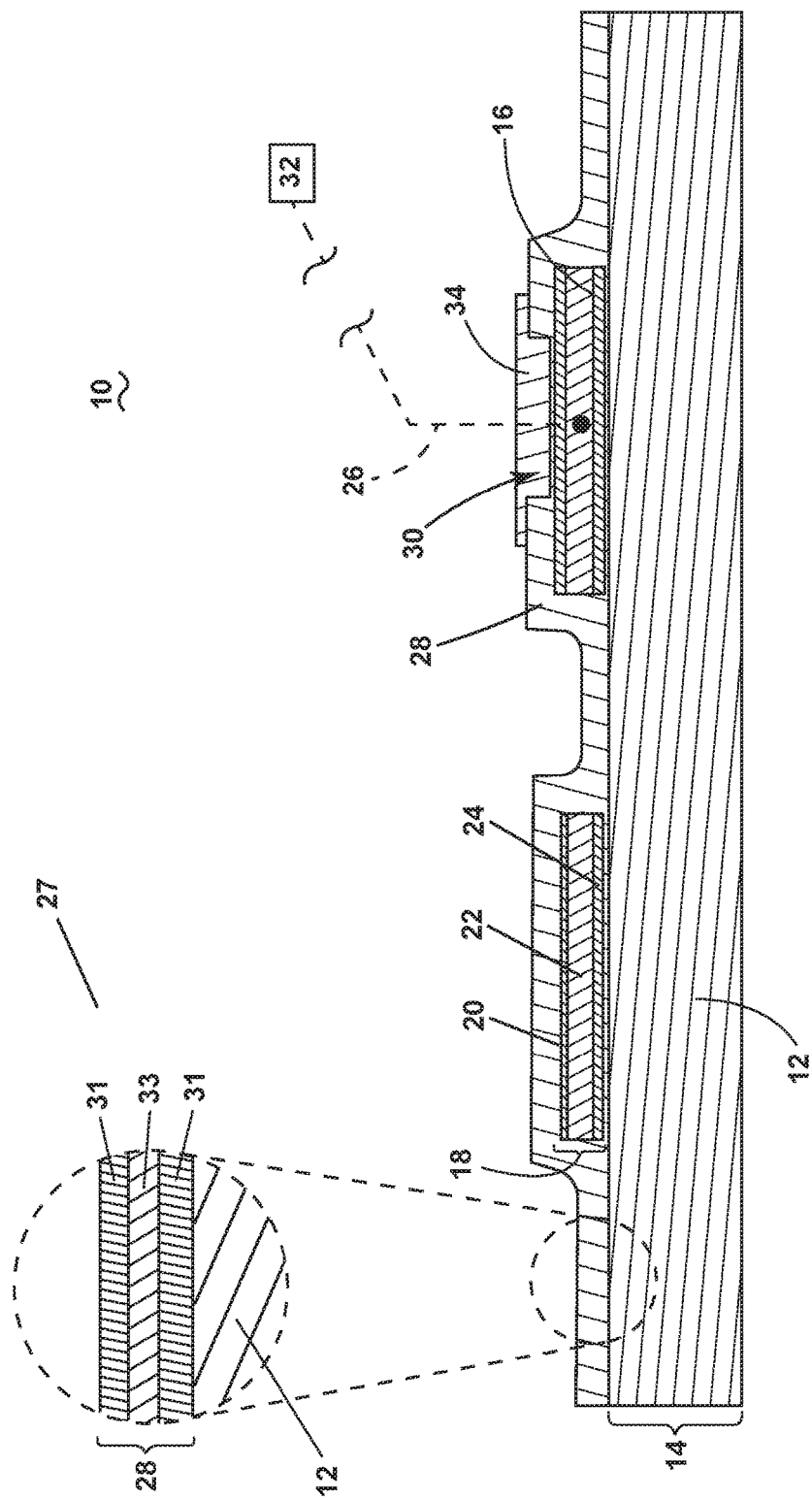
FIG. 1 is a cross section of an electrical component including a conductor stack.

FIG. 1 schematically illustrates a cross-section of an electronic device 10. The electronic device 10 is for operation in high temperature environments with an environmental temperature above 300° C. In particular, the electronic device 10 is for environments in which the temperature is between 400° C. and 900° C. The electronic device 10 can withstand temperatures up to 1000° C. By way of non-limiting example, the electronic device 10 as described herein can operate in an engine for an aircraft, in particular in an aft portion of the engine where temperatures exceed 300° C.

A substrate 12 defines a base 14 for the electronic device 10. The substrate 12 can be a semiconductor material or formed from a ceramic material. The substrate 12 can be formed from, for example silicon carbide. It is further contemplated that the substrate can be formed from any combination, by way of non-limiting example and not limited to, silicon, silicon-on-insulator, silicon carbide, silicon nitride, aluminum oxide, aluminum nitride, gallium nitride, or diamond.

A conductor stack 16 is mounted to the base 14 and includes multiple layers 18 composed of metals and metal silicides, by way of non-limiting example tantalum (Ta), tungsten (W), platinum (Pt), ruthenium (Ru), tantalum silicide (TaSi2), tungsten silicide (WSi2), platinum silicide (PtSi), and ruthenium oxide (RuO2). The multiple layers can include an upper layer 20, an inner layer 22, and an adhesion layer 24. Each layer can be between 50 nm and 1500 nm. The conductor stack 16 provides at least a portion of an electrically conductive path 26 for bonding wires that are attached to the electronic device 10. The conductor stack 16 can provide electrical interconnect between components and devices including, but not limited to transistors, resistors, capacitors, diodes, inductors, integrated circuits, and other semiconductor devices on the substrate 12. While illustrated as located on the top of the substrate, it is also contemplated that the conductor stack 16 can be located on the bottom of the substrate 12 or both the top and bottom of the substrate 12. For example to enable vertically stacked electronic components.

A dielectric passivation stack 28 is mounted to the base 14 and includes openings 30 to enable electrical contact to the conductor stack 16 for the electronic device 10. The dielectric passivation stack 28 encases at least a portion of the conductor stack 16 to protect the multiple layers 18. The openings 30 can be formed in the dielectric passivation stack 28 to provide the electrically conductive path 26 with connectivity between other electrical components 32 exterior to the dielectric passivation stack 28.

The dielectric passivation stack 28 can be formed from at least one layer of silicon dioxide, silicon nitride, and silicon oxynitride in non-limiting examples of dielectric materials. While illustrated as a solid cross-section for clarity, it is contemplated in a call-out 27 that the dielectric passivation stack 28 can be a layered stack of any combination of the dielectric materials. In one non-limiting example, the dielectric passivation stack 28 is a three layer film with outer layers 31 of silicon dioxide and an inner layer 33 of either silicon nitride or silicon oxynitride. The silicon nitride and silicon oxynitride can be can be deposited using a variety of plasma deposition techniques. Each provide their own benefits and depending on the application can be used in the dielectric passivation stack 28. As a passivation layer, silicon nitride is superior to silicon dioxide. Silicon oxynitride provides low leakage currents and high thermal stability. The outer layers 31 can be between 10 and 1000 nanometers, and the inner layer 33 can be between 10 and 300 nanometers.

An electrically conductive cap 34 can close the opening 30 to complete the electrically conductive path 26. The electrically conductive path 26 can begin at the base 14 and continue through the conductor stack 16, and end at the conductive cap 34. Bond wires can be attached to the conductive cap 34 for connection to the other electronic devices 32, i.e. connectors, or electronic housing. The electrically conductive cap 34 can be any conductive material, by way of non-limiting example, gold (Au), platinum (Pt), ruthenium (Ru), or any suitable material.

Figure 2:
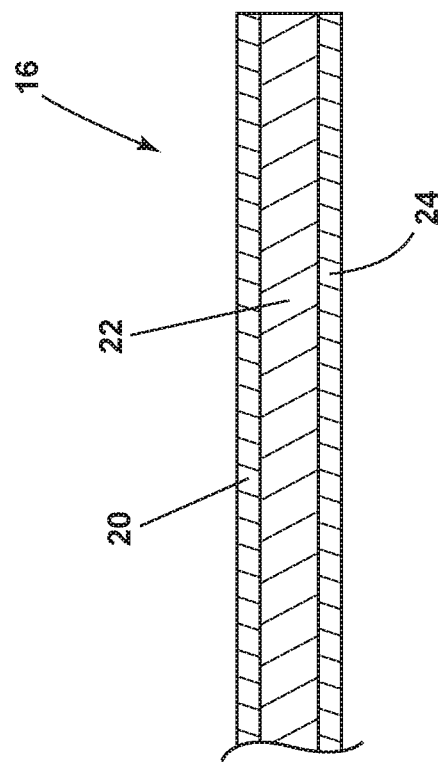
FIG. 2 is an enlarged cross section of the conductor stack of FIG. 1.
Figure 2:
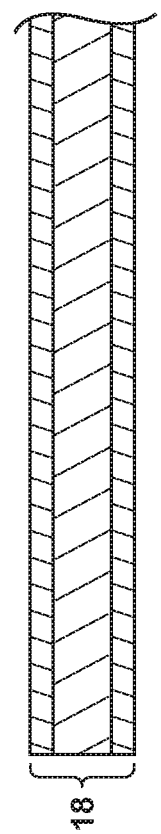

Turning to FIG. 2, the multiple layers 18 of the conductor stack 16 are layered in a specific layering order. The upper layer 20 can be formed of a highly conductive material, by way of non-limiting example at least one of tantalum (Ta), tungsten (W), tantalum silicide, tungsten silicide, gold (Au), platinum (Pt), or indium tin oxide (ITO). In a non-limiting example, the upper layer 20 includes indium tin oxide (ITO). It is further contemplated that the upper layer 20 is formed from an electro-migration resistant material, such as tungsten (W). It should be understood that the upper layer 20 can be both highly conductive and electro-migration resistant as well, in which case both tungsten (W) and gold (Au) are possible materials of which the upper layer 20 can be formed.

The inner layer 22 is a barrier material for slowing inter-diffusion of materials between layers. Barrier materials provide resistance to the diffusion of an element, by way of non-limiting example, tantalum (Ta), tungsten (W), or platinum (Pt), from the upper layer 20 into surrounding layers, including the base 14. High barrier resistance is necessary with conductive materials to prevent diffusion which can change the material properties of the surrounding layers, cause a change in film density, cracking, and ultimately leads to open or short circuits in the electronic device 10. The inner layer 22 is sandwiched between the upper layer 20 and the adhesion layer 24. By way of non-limiting example, the inner layer 22 is at least one of tantalum (Ta), ruthenium (Ru), or tantalum silicide (TaSi2).

The adhesion layer 24 is an adhesion material for improving adhesion of the other layers. In forming the electronic device 10, adhesion materials can be utilized to ensure good adhesion of subsequently applied material. By way of non-limiting example, adhesion layers for the highly conductive materials can include materials such as tantalum (Ta), vanadium (V), chromium (Cr), titanium (Ti), or tungsten alloy (W) and their nitrides which are good barrier materials and have good adhesion to the dielectric materials.

Figure 3:
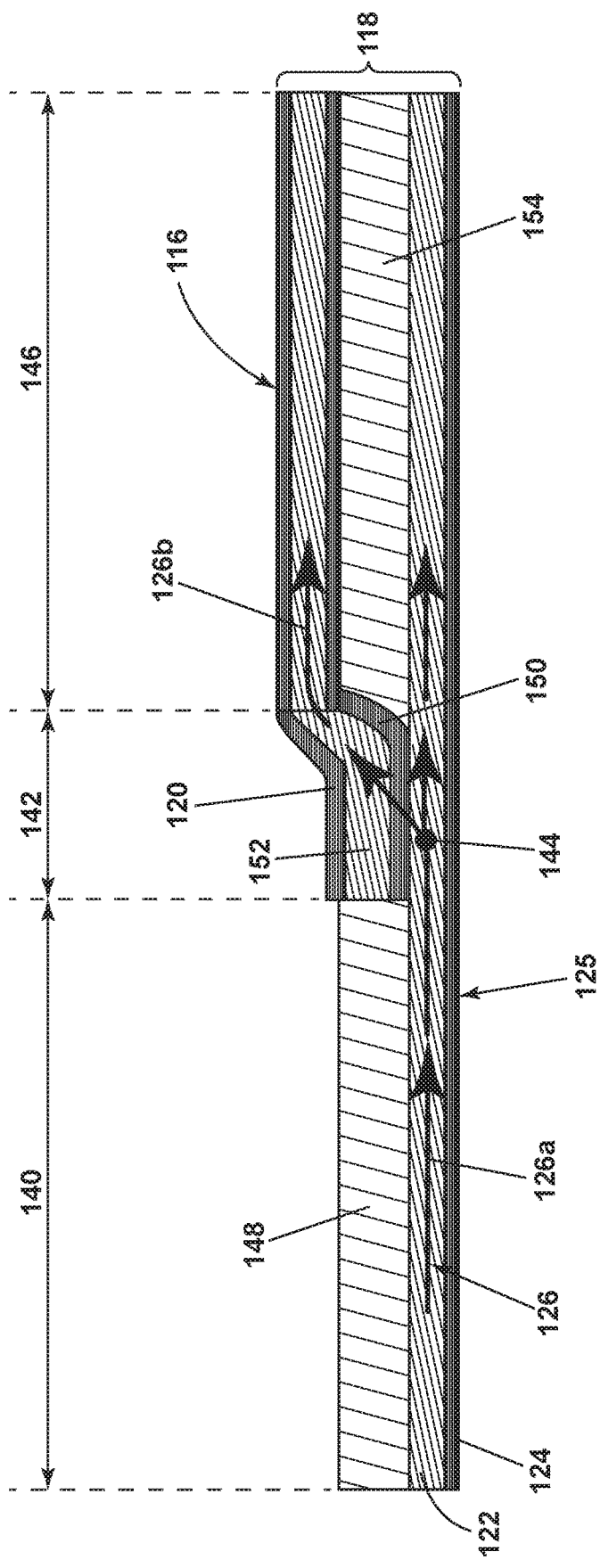
FIG. 3 is a variation of the conductor stack of FIG. 1 according to another aspect of the disclosure herein.

FIG. 3 illustrates a conductor stack 116 according to an aspect of the disclosure herein. The conductor stack 116 is similar to the conductor stack 16 therefore, like parts will be identified with like numbers increased by 100, with it being understood that the description of the like parts of the conductor stack 16 applies to the conductor stack 116 unless otherwise noted.

The conductor stack 116 can have multiple layers 118 stacked in multiple configurations. The multiple layers 118 can be formed from various materials including highly conductive materials, barrier materials, adhesion materials, and dielectric materials as already described herein. The conductor stack 116 can include three sections with various configurations of stacked layers forming different electrically conductive paths 126. It should be understood that while a certain number of layers is illustrated, these are non-limiting examples and the layers can be more or less than those illustrated depending on how the conductor stack 116 is designed to function.

In a non-limiting example, the conductor stack 116 has three sections. A first section 140 can include a first electrically conductive path 126a. A middle section 142 can include a fork 144 in the first electrically conductive path 126a to form two separate electrically conductive paths, the first electrically conductive path 126a and a second electrically conductive path 126b. A third section 146 can include the separated first and second electrically conductive paths 126a, 126b.

The first section 140 can be formed from three stacked layers, an adhesion layer 124, formed from an adhesion material, can define a base 125 of the conductor stack 116. A first dielectric layer 148, formed from a dielectric material, can cap off the first section 140. A first inner layer 122, formed from a barrier material, can be sandwiched between the adhesion layer 124 and the first dielectric layer 148. The adhesion layer 124 and first inner layer 122 define the first electrically conductive path 126a.

The middle section 142 can be formed from alternating layers of barrier materials and adhesion materials and capped with an upper layer 120 formed from a highly conductive material. In one non-limiting example the middle section 142 is formed from five stacked layers including the same adhesion layer 124 and first inner layer 122 from the first section 140. An intermediate layer 150, formed from an adhesion material, can be sandwiched between the first inner layer 122 and a second inner layer 152 formed from a barrier material. The upper layer 120 caps off the five stacked layers of the middle section 142. The addition of the intermediate layer 150 and the second inner layer 152 define the fork 144 and the subsequent second electrically conductive path 126b while the adhesion layer 124 and first inner layer 122 continue to define the first electrically conductive path 126a.

The third section 146 includes a second dielectric layer 154 sandwiched between the first inner layer 122 and the intermediate layer 150. Locating the second dielectric layer 154 within the conductor stack 116 enables multi-level electrically conductive paths 126a, 126b. The upper layer 120 continues in the third section to cap the conductive stack 116.

It should be understood that the stacking pattern as described herein can continue to form multiple forks and multiple electrically conductive paths. It should be further understood that the alternating of layers is between the barrier and adhesion materials, and that the upper layer 120 is only ever located on the top of the conductor stack 116 as described herein. It should be understood that the first and second dielectric layers 148, 154 can be formed using multiple layers of silicon dioxide, silicon nitride, and silicon oxynitride.

Figure 4:
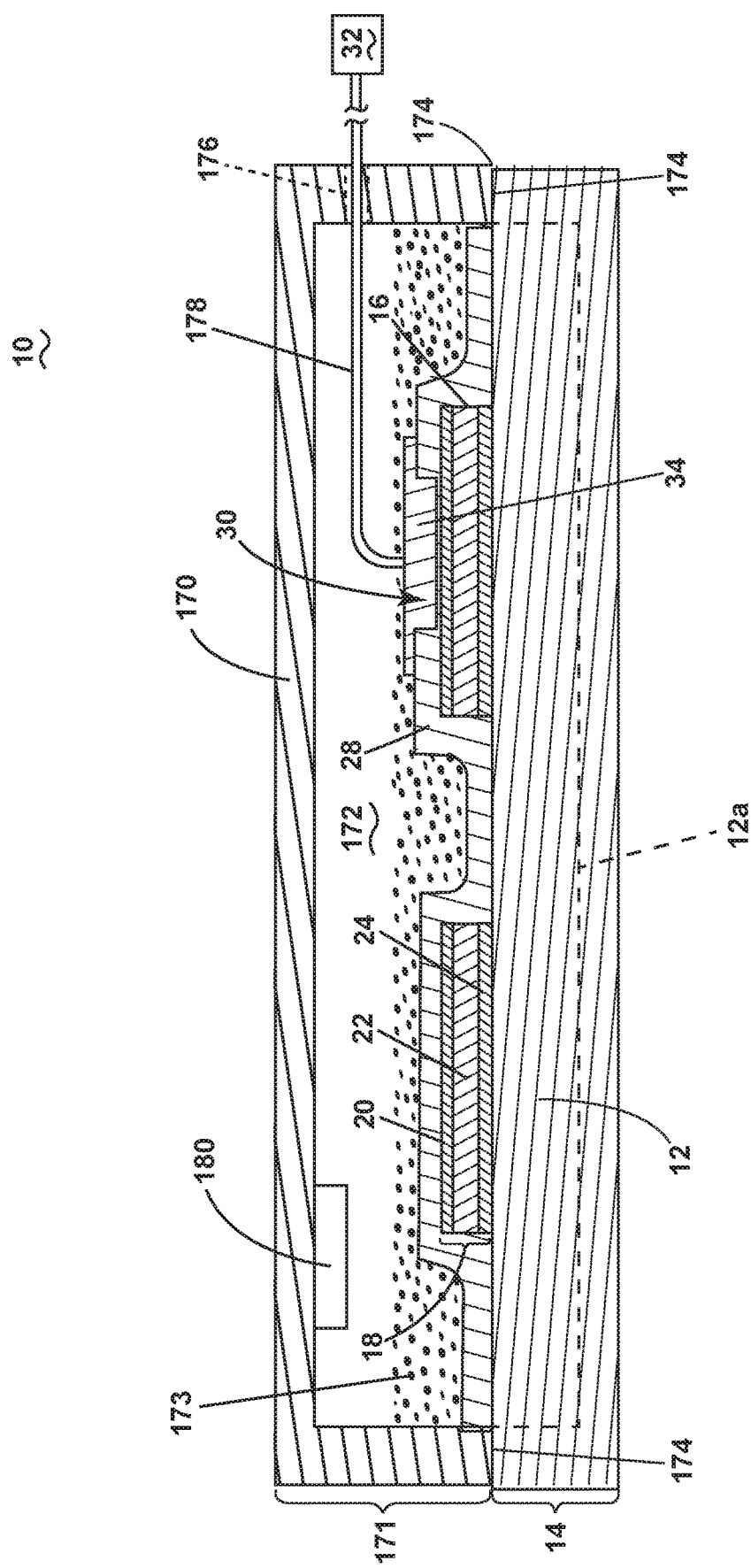
FIG. 4 is a cross section of the electrical component from FIG. 1 with a hermetic package and feedthrough.

FIG. 4 illustrates a hermetic package 170 mounted to the substrate 12 to define a cavity 172 encasing the electronic component 10. The cavity 172 provides room for wire bonding. While illustrated as mounted to the substrate, it is further contemplated that the hermetic package 170 can fully encase the electronic component 10 including the substrate 12 while having a separate substrate 12a illustrated in dashed line. While the electronic component 10 of FIG. 1 is illustrated, it should be understood that the conductor stacks 16, 116 as described herein can each be incorporated into the electronic component 10 of FIG. 4 as described herein. The hermetic package 170 can be sealed at multiple seal locations 174 to prevent gases and liquids from entering the cavity. In the event Kovar is used to form the hermetic package 170, the hermetic package can be sealed by selective local laser, resistance welding, or brazing using an intermediary material such as copper silver alloy. In the event silicon or silicon carbide is used to form the hermetic package 170, the sealing can be done using hydroxide silicate bonding. It should be understood that the hermetic package 170 can be formed from any appropriate material capable of encasing the electronic component 10 in a cavity that is sealed and protected from any gas or liquid entry.

It is further contemplated that the hermetic package 170 as described herein can be formed by stacking wafers, where a top portion 171 is a cap wafer and is bonded to the base 14 in the form of a device wafer. Both the cap wafer and the device wafer can have a metallic seal ring at the seal locations 174 that can be bonded together to form a continuous seal, by diffusion bonding, transient liquid phase bonding and hydroxide-catalysis bonding.

The cavity 172 can be evacuated of gasses to seal the electronic component 10 and all attached parts in a vacuum. It is also contemplated that the cavity 172 is fully or partially filled with an insulator 173, such as a ceramic slurry or powder, to encapsulate the electronic component 10 and associated parts. The slurry or powder may consist of the following types: $AlPO_4$, $CaO-Al_2O_3$, $MgO-P_2O_5$, $SiO_2$.

It is further contemplated that the insulator 173 is an inert gas, such as nitrogen or argon, to seal the electronic component 10 and associated parts. The hermetic package 170 can further include a getter material 180 to absorb or trap moisture or other contaminants remaining in the cavity 172 upon completion of sealing. The getter material 180 can be a non-evaporable type of material that is a pellet applied within the cavity of the chamber. A zirconium alloy, titanium alloy, metal hydride based, or rare earth element based getter material can be employed depending on the known contaminant targeted, by way of non-limiting example, water or hydrogen.

The hermetic package 170 can include at least one hole, or feedthrough 176, through which an electrical connection, illustrated by a wire 178, can occur. The feedthrough 176 can be round to keep a uniform stress/pressure on the wire 178. The feedthrough 176 can be sealed using a partially metallized ceramic with braze joints, a glass, a cofired ceramic, or a polycrystalline ceramic. The feedthrough 176 can be formed from a material resistant to higher temperatures as described herein. It is further contemplated that the material can be, by way of non-limiting example, polycrystalline ceramic as well. The feedthrough 176 can provide electrical connection via the wire 178 from outside the hermetic package 170 to the electrical component 10. It should be understood that the feedthrough 176 is formed in such a way that the cavity 172 remains sealed from any gas or liquid entry into the cavity 172.

Figure 5:
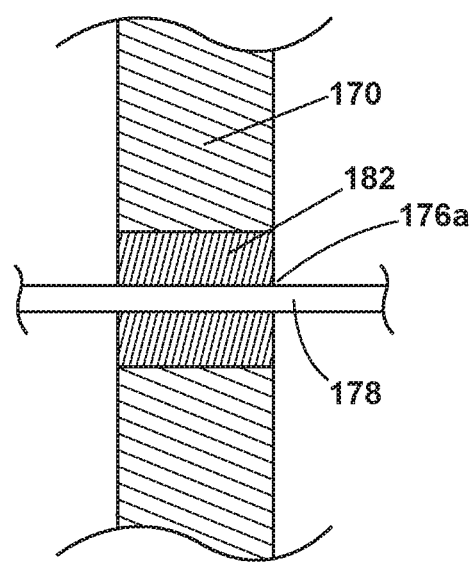
FIG. 5 is an enlarged cross-section of a variation of the feedthrough from FIG. 4.

Turning to FIG. 5, in one exemplary feedthrough 176a, the wire 178 is encapsulated by an exemplary first package 182. The first package 182 can be formed from a glass, polycrystalline ceramic or a cofired ceramic. The first package 182 can be bonded directly to the wire and the hermetic package 170.

Figure 6:
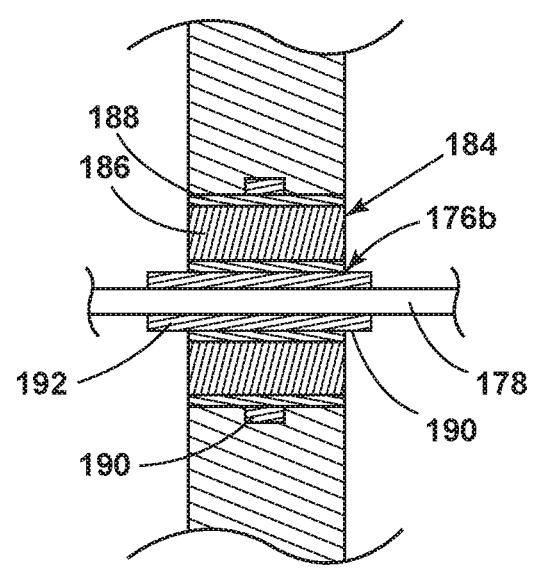
FIG. 6 is an enlarged cross-section of another variation of the feedthrough from FIG. 4.

Turning to FIG. 6, in another exemplary feedthrough 176b, the wire 178 is encapsulated by an exemplary second package 184. The second package 184 can be a partially metallized ceramic package with ceramic eyelets 186 that having a metallized coat 188. The second package 184 can be brazed to the wire and hermetic package at brazed joints 190. In one example, the hermetic package 170 can be a single device-level where the hermetic package 170 is a transistor outline metal package having metal pins 192 that enable an electrical connection. While illustrated with a wire 178 passing through the metal pin 192, it should be understood that a wire can be connected to one end of the metal pin 192 on the outside and another wire connected to the interior end of the metal pin 192.

Figure 7:
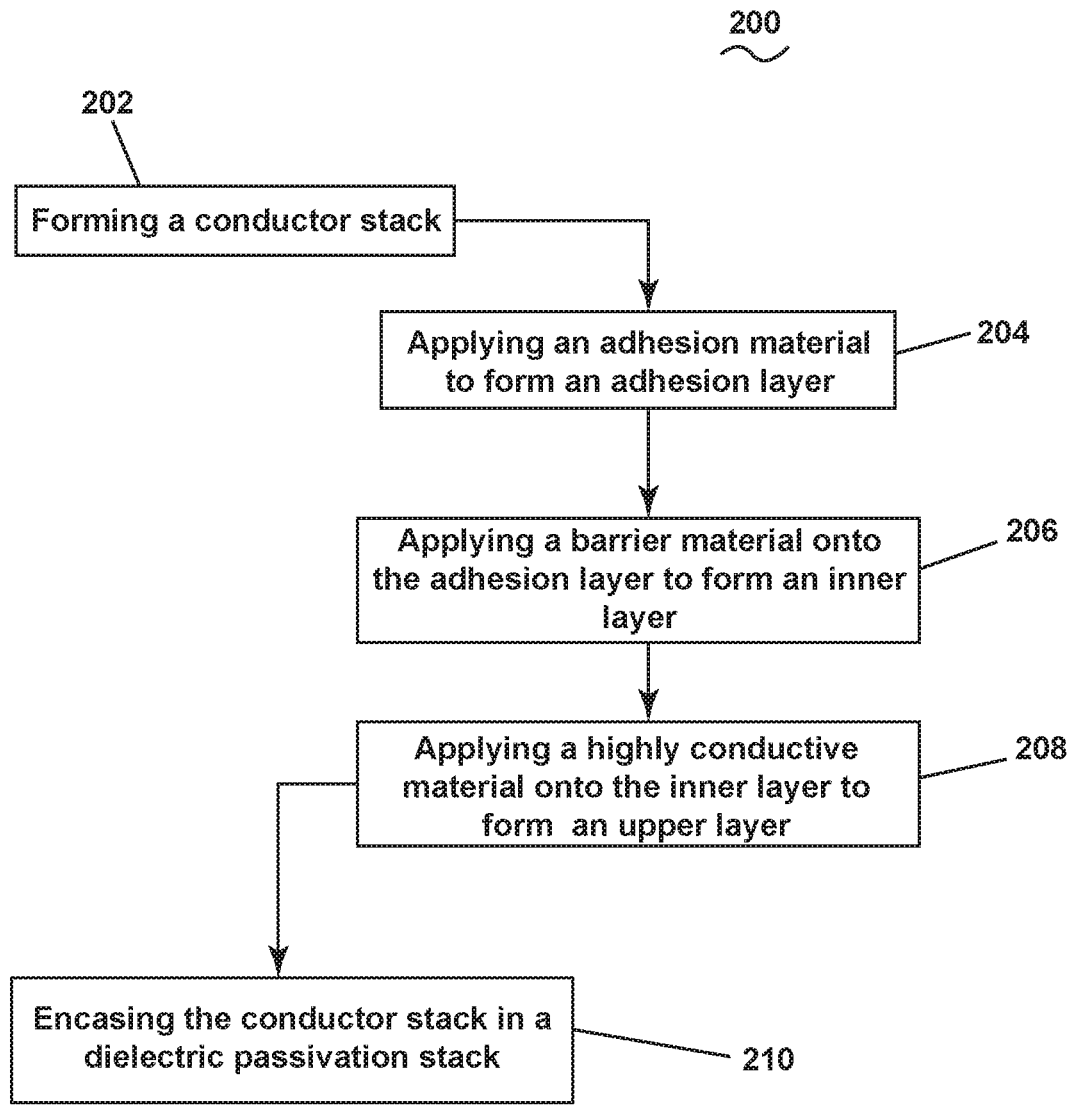
FIG. 7 is flow chart for a method of manufacturing the electrical component of FIG. 1.

Turning to FIG. 7, a flow chart for a method 200 of manufacturing the electronic component 10 is illustrated. At 202 forming a conductor stack 16 by at 204 applying an adhesion material, by way of non-limiting example vanadium (V), to form the adhesion layer 24. At 206 applying a barrier material, by way of non-limiting example tantalum silicide (TaSi) onto the adhesion layer 24 to form the inner layer 22. At 208 applying a highly conductive material, by way of non-limiting example indium tin oxide (ITO), onto the inner layer 22 to form the upper layer 20. At 210 encasing the conductor stack 16 in the dielectric passivation stack 28.

The method 200 can further include forming the conductor stack 116 as described herein with alternating inner and adhesion layers to define multiple electrically conductive paths 126a, 126b. The method 200 can also include bonding the hermetic package 170 to the substrate 12 to define the cavity 172 as described herein. The method 200 can include forming the at least one opening 30 in the passivation stack 28 for an electrical connection, via the exemplary wire 178.

It is further contemplated that metallization of the multiple layers 18, 118 described herein occurs in the hermetic package 170. This can include forming at least one adhesion layer from a silicide by applying silicon in between metal layers and annealing the at least one adhesion layer to form the metal silicide.

The method can further include forming the dielectric passivation stack 28 in the three layers described herein, the two outer layers 31 and the one inner layer 33. The layers can be formed and deposited in one continuous processing step with the same deposition machine under vacuum. The dielectric passivation stack can be annealed at a temperature between 500° C. to 900° C. in an inert atmosphere, of nitrogen, argon, or in a vacuum, for a duration of between 1 hour and 24 hours. It is further contemplated that annealing the dielectric passivation stack 28 also serves to anneal and react the layers 18 of the conductor stack 16 to form the final conductor stack 16 configuration.

The method can further include depositing a silicon rich silicide as a starting material between layers of metals and annealing the layers to produce a desired silicon compound layer. For example, using silicon rich tantalum silicide sandwiched between titanium and platinum, then anneal the stack to form titanium silicide and platinum silicide at the interfaces between layers.

It is further contemplated that the method 200 includes forming at least one adhesion layer from a silicide. Forming a silicide can be done by applying poly-crystalline silicon or silicon-rich metal silicides adjacent or in between metal layers. For example, a layer of platinum can be applied, then a layer of silicon can be applied, then another layer of platinum can be applied. Upon completion of applying the silicon between the platinum metal layers, the layer can be annealed at high temperature to react the multi-layer stack to form platinum silicide.

The electronic device described herein increases the lifetime of electronic devices that operate in high temperature environments. The multiple stacked layers formed in the order described herein slows down or prevents corrosion of the conductor stack. This increases the lifetime of the electrically conductive paths and in turn increases the lifetime of the electronic device.

To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure herein, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

Further aspects of the disclosure are provided by the subject matter of the following clauses:

An electrical component comprising a substrate defining a base of the electrical component; a conductor stack having multiple stacked layers including an upper layer, an inner layer, and an adhesion layer, defining at least a portion of an electrically conductive path, and mounted to the substrate; a dielectric passivation stack encasing at least a portion of the conductor stack and defining at least one opening for connection to the electrically conductive path; and an electrically conductive cap configured to close the opening and further defining the electrically conductive path.

The electrical component of any preceding clause, wherein the upper layer is made of a highly conductive or electro-migration resistant material, the inner layer is made of a barrier material for slowing inter-diffusion of materials between layers, and the adhesion layer is made of an adhesion material for improving adhesion of the other layers.

The electrical component of any preceding clause, wherein the conductor stack further comprises alternating multiple inner and adhesion layers with one of the multiple adhesion layers defining a base of the conductor stack facing the substrate.

The electrical component of any preceding clause, wherein the highly conductive material includes at least one of gold, platinum, or indium tin oxide.

The electrical component of any preceding clause, wherein the barrier material includes at least one of tantalum, ruthenium, tantalum silicide, or molybdenum.

The electrical component of any preceding clause, wherein the adhesion material is at least one of tantalum, vanadium, chromium, titanium, and tungsten alloy.

The electrical component any preceding clause, wherein the dielectric passivation stack is made of at least one layer of silicon dioxide, silicon nitride, or silicon oxynitride.

The electrical component of any preceding clause, wherein the dielectric passivation stack is a three layer film with outer layers of silicon dioxide and an inner layer of either silicon nitride or silicon oxynitride.

The electrical component of any preceding clause, wherein the outer layers are between 10 nanometers and 1000 nanometers, and the inner layer is between 10 nanometers and 300 nanometers.

The electrical component of any preceding clause, further comprising a hermetic package defining a cavity in which the conductor stack and dielectric passivation stack are located.

The electrical component of any preceding clause, wherein the substrate forms the base of the hermetic package.

The electrical component of any preceding clause, wherein the hermetic package includes at least one feedthrough slot.

The electrical component of any preceding clause, wherein the hermetic package includes a getter material located within the cavity to absorb or trap contaminants.

The electrical component of any preceding clause, wherein the cavity is filled with a solid material or a gas, or defines a vacuum.

A method of manufacturing an electronic component comprising forming a conductor stack with multiple stacked layers comprising applying an adhesion material to form an adhesion layer; applying a barrier material on the adhesion layer to form an inner layer; applying a highly conductive material onto the inner layer to form an upper layer; and encasing the conductor stack in a dielectric passivation stack forming at least one opening in the passivation stack for an electrical connection.

The method of any preceding clause, further comprising forming the conductor stack with alternating inner and adhesion layers to define multiple electrically conductive paths.

The method of any preceding clause, further comprising bonding a hermetic package to the substrate to define a cavity in which the conductor stack and dielectric passivation stack are located.

The method of any preceding clause, further comprising depositing a silicon rich silicide as starting material between layers of metals, and annealing the layers to produce a desired silicon compound layer.

The method of any preceding clause, further comprising forming at least one adhesion layer from a silicide by applying silicon in between metal layers and annealing the at least one adhesion layer to form a metal silicide.

The method of any preceding clause, further comprising annealing the dielectric passivation stack at a temperature between 500° C. to 900° C. in an inert atmosphere for a duration of between 1 hour and 24 hours wherein annealing the dielectric passivation stack also serves to anneal and react the conductor stack to form a final conductor stack configuration.

The method of any preceding clause, further comprising forming at least one opening in the passivation stack for an electrical connection.

The method of any preceding clause, further comprising forming the dielectric passivation stack in 3 layers formed and deposited in one continuous processing step with the same deposition machine under vacuum.

What is claimed is:

1. An electrical component comprising:
a substrate defining a base of the electrical component;
a conductor stack disposed adjacent to the base having multiple stacked layers and mounted to the substrate, the multiple stacked layers including an upper layer, an inner layer, and an adhesion layer;
a dielectric passivation stack in contact with the conductor stack and the base encasing at least a portion of the conductor stack, and the dielectric passivation stack forming a cavity therein; and
an electrically conductive cap placed in the cavity and being in contact with the dielectric passivation stack and configured to close the cavity, wherein an electrically conductive path extends from the base, through the conductor stack, through the dielectric passivation stack, through the electrically conductive cap, through a bond wire attached to the electrically conductive cap, and to an external electrical component,
wherein the conductor stack has a bottom surface, and an entirety of the bottom surface being flat and adjacent to the substrate,
wherein the electrical component is configured to operate in an environment having a temperature in excess of 300° C.

2. The electrical component of claim 1, wherein the upper layer is made of a highly conductive material or an electromigration resistant material, the inner layer is made of a barrier material for slowing inter-diffusion of materials between layers, and the adhesion layer is made of an adhesion material for improving adhesion of the other layers.

3. The electrical component of claim 2, wherein the conductor stack further comprises alternating multiple inner layers and multiple adhesion layers with one of the multiple adhesion layers defining a base of the conductor stack facing the substrate.

4. The electrical component of claim 2, wherein the highly conductive material includes at least one of gold, platinum, or indium tin oxide.

5. The electrical component of claim 2, wherein the barrier material includes at least one of tantalum, ruthenium, tantalum silicide, or molybdenum.

6. The electrical component of claim 2, wherein the adhesion material is at least one of tantalum, vanadium, chromium, titanium, and tungsten alloy.

7. The electrical component of claim 1, wherein the dielectric passivation stack is made of at least one layer of silicon dioxide, silicon nitride, or silicon oxynitride.

8. The electrical component of claim 7, wherein the dielectric passivation stack is a three layer film with outer layers of silicon dioxide and an inner layer of either silicon nitride or silicon oxynitride.

9. The electrical component of claim 8, wherein the outer layers are between 10 nanometers and 1000 nanometers, and the inner layer is between 10 nanometers and 300 nanometers.

10. The electrical component of claim 1, further comprising a hermetic package defining a volume in which the conductor stack and the dielectric passivation stack are located.

11. The electrical component of claim 10, wherein the substrate forms the base of the hermetic package.

12. The electrical component of claim 10, wherein the hermetic package includes at least one feedthrough slot.

13. The electrical component of claim 10, wherein the hermetic package includes a getter material located within the volume to absorb or trap contaminants.

14. The electrical component of claim 10, wherein the volume is filled with a solid material or a gas, or defines a vacuum.

15. The electrical component of claim 1, wherein the substrate is a semiconductor material.

16. The electrical component of claim 1, wherein the substrate is formed from a ceramic material.

17. The electrical component of claim 1, wherein a hermetic package includes a feedthrough sealed using a partially metallized ceramic.

* * * * *